(12) United States Patent
Kanemitsu et al.

(10) Patent No.: US 11,460,565 B2
(45) Date of Patent: Oct. 4, 2022

(54) ULTRASONIC SENSOR

(71) Applicant: DENSO CORPORATION, Kariya (JP)

(72) Inventors: Hiroshi Kanemitsu, Kariya (JP); Kenji Fukabori, Kariya (JP)

(73) Assignee: DENSO CORPORATION, Kariya (JP)

(*) Notice: Subject to any disclaimer, the term of this patent is extended or adjusted under 35 U.S.C. 154(b) by 309 days.

(21) Appl. No.: 16/885,472

(22) Filed: May 28, 2020

(65) Prior Publication Data

US 2020/0292682 A1  Sep. 17, 2020

Related U.S. Application Data

(63) Continuation of application No. PCT/JP2018/042356, filed on Nov. 15, 2018.

(30) Foreign Application Priority Data

Nov. 30, 2017  (JP) .............................. JP2017-230722

(51) Int. Cl.
| | | |
|---|---|---|
| *B06B 1/06* | (2006.01) | |
| *G01S 7/521* | (2006.01) | |
| *G01S 7/52* | (2006.01) | |
| *G01S 15/931* | (2020.01) | |
| *H01L 41/053* | (2006.01) | |
| *H01L 41/113* | (2006.01) | |
| *H04R 3/00* | (2006.01) | |
| *H04R 17/00* | (2006.01) | |

(52) U.S. Cl.
CPC .......... *G01S 7/521* (2013.01); *G01S 7/52004* (2013.01); *G01S 15/931* (2013.01); *H01L 41/053* (2013.01); *H01L 41/113* (2013.01); *H04R 3/00* (2013.01); *H04R 17/00* (2013.01); *G01S 2007/52009* (2013.01)

(58) Field of Classification Search
CPC .... G01S 7/521; G01S 7/52004; G01S 15/931; G01S 2007/52009; G01S 2007/52011; H01L 41/053; H01L 41/113; H04R 3/00; H04R 17/00
USPC ......................................................... 367/140
See application file for complete search history.

(56) References Cited

U.S. PATENT DOCUMENTS

| | | |
|---|---|---|
| 2002/0130770 A1 | 9/2002 | Keyworth et al. |
| 2009/0211360 A1 | 8/2009 | Rapps et al. |
| 2018/0149694 A1 | 5/2018 | Miyazaki et al. |

FOREIGN PATENT DOCUMENTS

| | | |
|---|---|---|
| CN | 103274349 A | 9/2013 |
| CN | 206330993 U | 7/2017 |
| JP | 2012-065405 A | 3/2012 |

*Primary Examiner* — Richard Tan
(74) *Attorney, Agent, or Firm* — Maschoff Brennan

(57) ABSTRACT

A shield member electromagnetically shielding at least part of an electric circuit has a first end and a second end. The first end is configured to be constantly connected to a ground wire to electromagnetically shield at least part of the electric circuit; and the second end is configured to be selectively connectable to a power source, the shield member being configured to generate heat when energized while the second end is connected to the power source. Accordingly, the shield member electromagnetically shielding at least the part of the electric circuit can serve as a heater for preventing freezing and snow attachment.

9 Claims, 6 Drawing Sheets

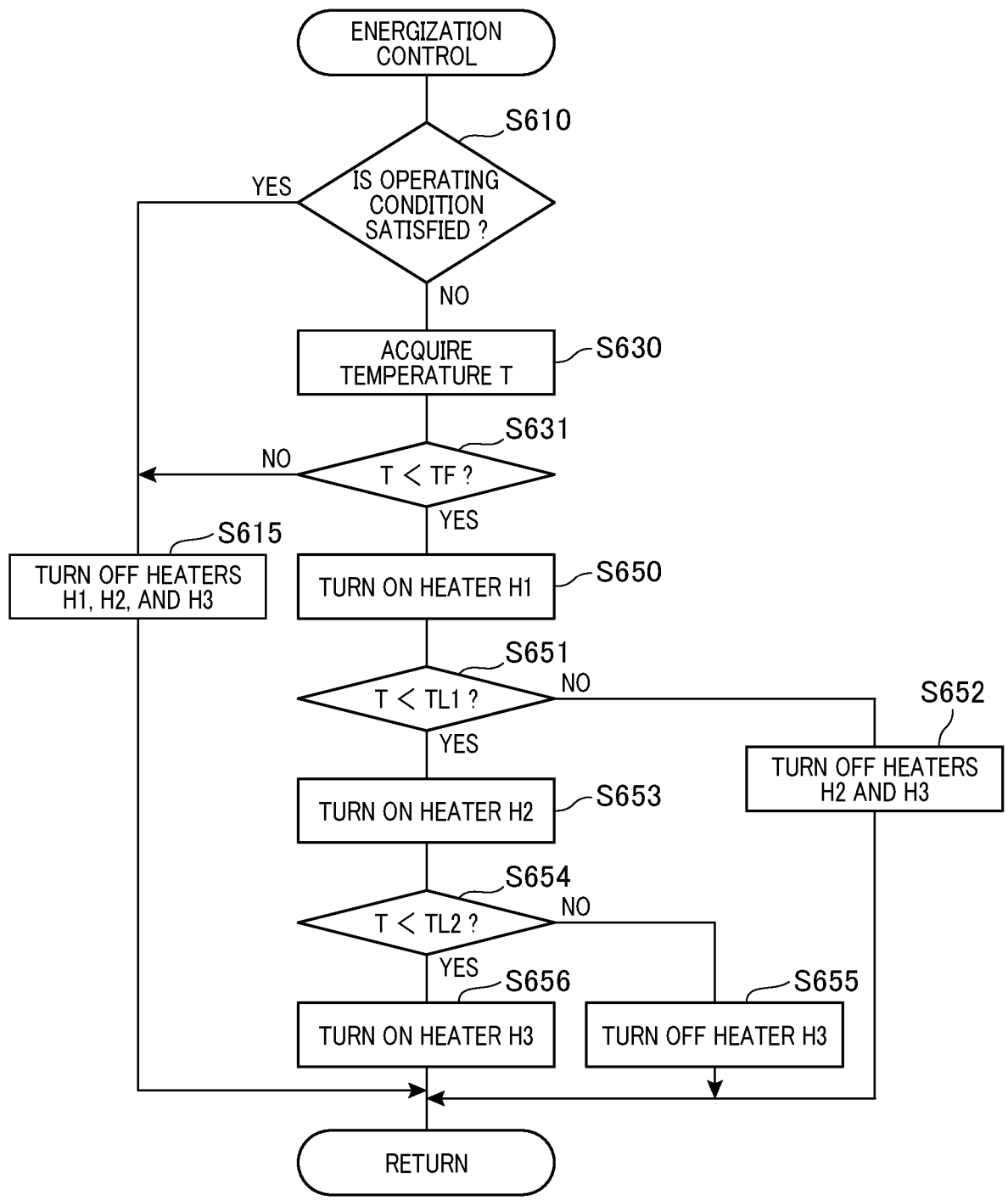

ULTRASONIC SENSOR

CROSS-REFERENCE TO RELATED APPLICATION

The present application is a continuation application of International Application No. PCT/JP2018/042356, filed on Nov. 15, 2018, which claims priority to Japanese Patent Application No. 2017-230722 filed on Nov. 30, 2017. The contents of these applications are incorporated herein by reference in their entirety.

BACKGROUND

Technical Field

The present invention relates to an ultrasonic sensor.

Background Art

There have been known ultrasonic sensors that detect an object through transmission and reception of ultrasonic waves. Specifically, this type of ultrasonic sensors transmits ultrasonic waves by a vibration element such as a piezoelectric element exciting a diaphragm part. Then, this type of ultrasonic sensors detects objects by converting the vibration of the diaphragm part accompanying the reception of waves reflected from the object to which the ultrasonic wave has been transmitted into an electrical signal.

SUMMARY

In the present disclosure, provided is an ultrasonic sensor as the following. The ultrasonic sensor includes: an ultrasonic wave transceiver; a sensor case; and a shield member that electromagnetically shields at least part of an electric circuit including a vibration element and a control board, and has a first end and a second end. The first end of the shield member is configured to be constantly connected to a ground wire to electromagnetically shield at least part of the electric circuit; and the second end is configured to be selectively connectable to a power source, the shield member being configured to generate heat when energized while the second end is connected to the power source.

BRIEF DESCRIPTION OF THE DRAWINGS

FIG. 6 is a flowchart illustrating an operation example of a control unit illustrated in FIG. 5.

DETAILED DESCRIPTION OF THE PREFERRED EMBODIMENTS

Figure 1:
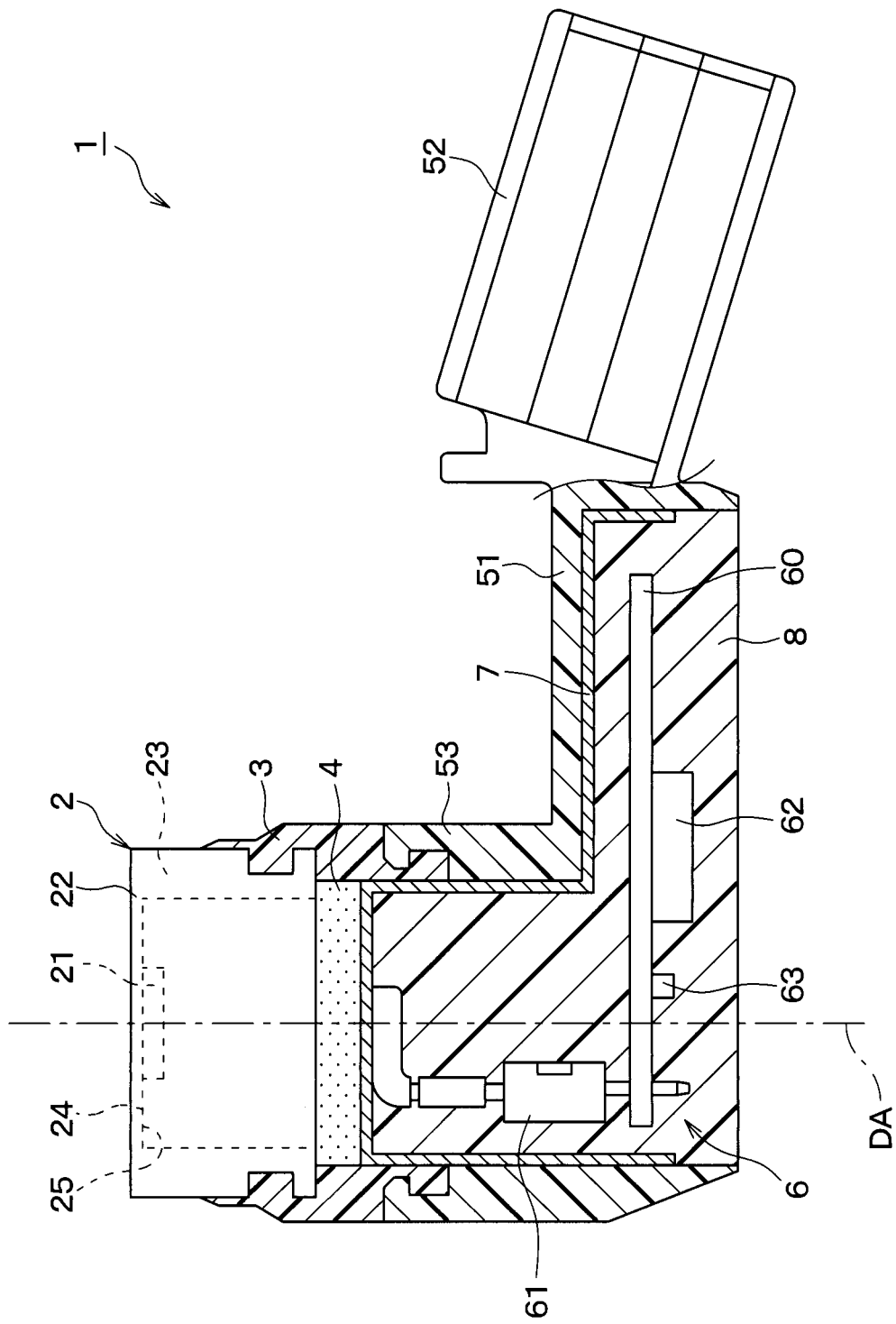
FIG. 1 is a side cross-sectional view of a schematic device configuration of an ultrasonic sensor according to an embodiment.

When the diaphragm part in the ultrasonic sensors described above is covered with ice or snow in a low-temperature environment, the ultrasonic sensors decrease in detection performance. Thus, there has been conventionally known to provide a heater for heating the diaphragm part (for example, see PTL 1).

[PTL 1] U.S. Patent Application Publication No. 2009/0211360

Adding a heater to an ultrasonic sensor in order to prevent or eliminate freezing and snow attachment as described in PTL 1 and others provides a disadvantage of rise in manufacturing cost due to the increase in number of components. The present disclosure has been devised in view of the circumstances described above.

According to one aspect of the present disclosure, an ultrasonic sensor includes: an ultrasonic wave transceiver that includes a vibration element with a function for converting between mechanical vibration and an electrical signal and a transceiver case configured to cover the vibration element; a sensor case that accommodates a control board electrically connected to the ultrasonic wave transceiver and supports the ultrasonic wave transceiver; and a shield member that electromagnetically shields at least part of an electric circuit including the vibration element and the control board, and has a first end and a second end. The first end of the shield member is configured to be constantly connected to a ground wire to electromagnetically shield at least part of the electric circuit; and the second end is configured to be selectively connectable to a power source, the shield member being configured to generate heat when energized while the second end is connected to the power source.

In the foregoing configuration, the first end of the shield member is configured to be constantly connected to a ground wire to electromagnetically shield at least part of the electric circuit. In addition, the second end is configured to be selectively connectable to a power source, the shield member being configured to generate heat when energized while the second end is connected to the power source.

That is, in the foregoing configuration, the shield member electromagnetically shielding at least the part of the electric circuit can serve as a heater for preventing or eliminating freezing and snow attachment. Therefore, according to this configuration, it is possible to prevent or eliminate freezing and snow attachment in the ultrasonic sensor while suppressing a rise in manufacturing cost due to increase of components as much as possible.

Reference signs in parentheses assigned to elements merely show examples of correspondences between the elements and specific units in embodiments described later. Thus, the present disclosure is not limited by the description of the reference signs.

EMBODIMENTS

Hereinafter, embodiments will be described with reference to the drawings. Various modifications applicable to one embodiment will be collectively explained after the description of the embodiment because there is a risk that insertion of description of the modifications into the description of the embodiment may disturb understanding of the embodiment.

(Entire Configuration)

First, an overall configuration of an ultrasonic sensor 1 according to the present embodiment will be described with reference to FIG. 1. As illustrated in FIG. 1, the ultrasonic sensor 1 includes an ultrasonic wave transceiver 2, an elastic holding member 3, a damper member 4, a sensor case 5, an electric circuit 6, a shield member 7, and a filling material 8.

The ultrasonic wave transceiver 2 is made capable of transmitting and receiving ultrasonic waves. Specifically, the ultrasonic wave transceiver 2 is configured to transmit an probe wave along a directional axis DA based on an applied drive signal and receive a reflection wave reflected from an object existing in the surroundings and generate a reception signal. Hereinafter, a direction parallel to the directional axis DA will also be called "axial direction". A "leading end side in the axial direction" corresponds to the upper side in FIG. 1. A "base end side in the axial direction" corresponds to the lower side in FIG. 1. Directions orthogonal to the axial direction will also be called "in-plane direction".

The ultrasonic wave transceiver 2 has a vibration element 21 and a transceiver case 22. The vibration element 21 is an electrical element that has a function of converting between mechanical vibration and an electrical signal, which is formed of a piezoelectric element or the like.

The transceiver case 22 is provided to cover the vibration element 21. In the present embodiment, the transceiver case 22 has a bottomed cylindrical outer shape with a central axis line along the directional axis DA. Specifically, the transceiver case 22 has a diaphragm support part 23 and a diaphragm part 24. In the present embodiment, the transceiver case 22 is integrally formed in a seamless manner from a metal such as aluminum.

The diaphragm support part 23 is formed in a cylindrical shape extended along the directional axis DA. The diaphragm part 24 is a thin-plate part that blocks the leading end side of the diaphragm support part 23 in the axial direction and is provided to constitute a top plate part of the transceiver case 22.

The diaphragm back surface 25 serves as an inner surface of the diaphragm part 24, and the vibration element 21 is fixed to a substantially central part of the diaphragm back surface 25 in a corresponding in-plane direction, and that is, the vibration element 21 is provided on the leading end side of the ultrasonic wave transceiver 2 in the axial direction. The diaphragm part 24 is excited by vibration of the vibration element 21 due to application of a drive signal or by reception of a reflection wave such that an outer edge part fixedly supported by the diaphragm support part 23 is used as a fixed end.

The elastic holding member 3 is formed of a synthetic resin elastic material such as silicon rubber with an insulation property and elasticity. The synthetic resin elastic material is also called viscoelastic material or elastomer. The elastic holding member 3 has a substantially cylindrical shape. The elastic holding member 3 is configured to elastically support the ultrasonic wave transceiver 2 by covering the base end side of the ultrasonic wave transceiver 2 while exposing the leading end side of the same in the axial direction.

The damper member 4 is a disc-shaped member that has an outer diameter corresponding to an inner diameter of the elastic holding member 3. That is, the damper member 4 is embedded in a cylindrical space inside the elastic holding member 3 closer to the base end than a part of the elastic holding member 3 elastically supporting the ultrasonic wave transceiver 2 in the axial direction. The damper member 4 is formed by a foamed elastic body such as foamed silicon with an insulation property and elasticity to suppress transfer of vibration from the ultrasonic wave transceiver 2 to the sensor case 5.

The sensor case 5 constituting the housing of the ultrasonic sensor 1 is configured to hold the base end part of the elastic holding member 3 in the axial direction. That is, the ultrasonic wave transceiver 2 is supported by the sensor case 5 via the elastic holding member 3.

In the present embodiment, the sensor case 5 has a case main body part 51, a connector part 52, and a case tubular part 53. The sensor case 5 is integrally formed of a rigid synthetic resin such as polypropylene.

The case main body part 51 is a box-like part in a substantially rectangular parallelepiped shape and is formed in a bottomed cylindrical shape in which the base end side in the axial direction is opened. The connector part 52 is extended outward from a side wall part of the case main body part 51 in order to electrically connect the ultrasonic sensor 1 to an external device such as an electronic control unit.

The case tubular part 53 is a substantially cylindrical part that is protruded from the case main body part 51 toward the leading end in the axial direction. The cylindrical space inside the case tubular part 53 is provided to communicate with the substantially rectangular parallelepiped space inside the case main body part 51. Hereinafter, the part of the space inside the case tubular part 53 excluding the portion occupied by the damper member 4 and the space inside the case main body part 51 will be collectively called space inside the sensor case 5.

The space inside the sensor case 5 accommodates a control board 60 and a wiring part 61 constituting the electric circuit 6, and the shield member 7. That is, the sensor case 5 is configured to elastically support the ultrasonic wave transceiver 2 while storing the wiring part 61 and the control board 60 electrically connected to the ultrasonic wave transceiver 2 via the wiring part 61.

The electric circuit 6 formed inside the ultrasonic sensor 1 includes the vibration element 21, the control board 60, and the wiring part 61. The control board 60 has a plurality of electric circuit elements including a control circuit unit 62 and a temperature sensor 63.

The control circuit unit 62 is provided to control operations of the ultrasonic sensor 1. That is, the control circuit unit 62 is configured to control transmitting and receiving operations performed by the ultrasonic wave transceiver 2 based on control signals received from an external device such as an electronic control unit. The control circuit unit 62 is configured to transmit to an external device an object detection signal corresponding to a reception signal obtained by transmitting and receiving operations performed by the ultrasonic wave transceiver 2. The temperature sensor 63 is provided to generate an output indicative (for example, voltage) of the temperature of the ultrasonic sensor 1.

In the present embodiment, the shield member 7 is provided in the sensor case 5 to electromagnetically shield at least part of the electric circuit 6. Specifically, the shield member 7 is fixed to the inner surface of the sensor case 5 to cover the control board 60 and the wiring part 61 extending from the damper member 4 toward the base end in the axial direction in the space inside the sensor case 5.

The shield member 7 is configured to perform both the electromagnetic shield function and the heat generation function. Specifically, in the present embodiment, the shield member 7 is formed in a thin-plate or wire mesh shape from a metal resistor such as a nickel-chrome alloy. The electrical connection of the shield member 7 will be described later.

The space inside the sensor case 5 is filled with a filling material 8 such as silicon rubber with an insulation property and elasticity.

(Circuit Configuration)

Figure 2:
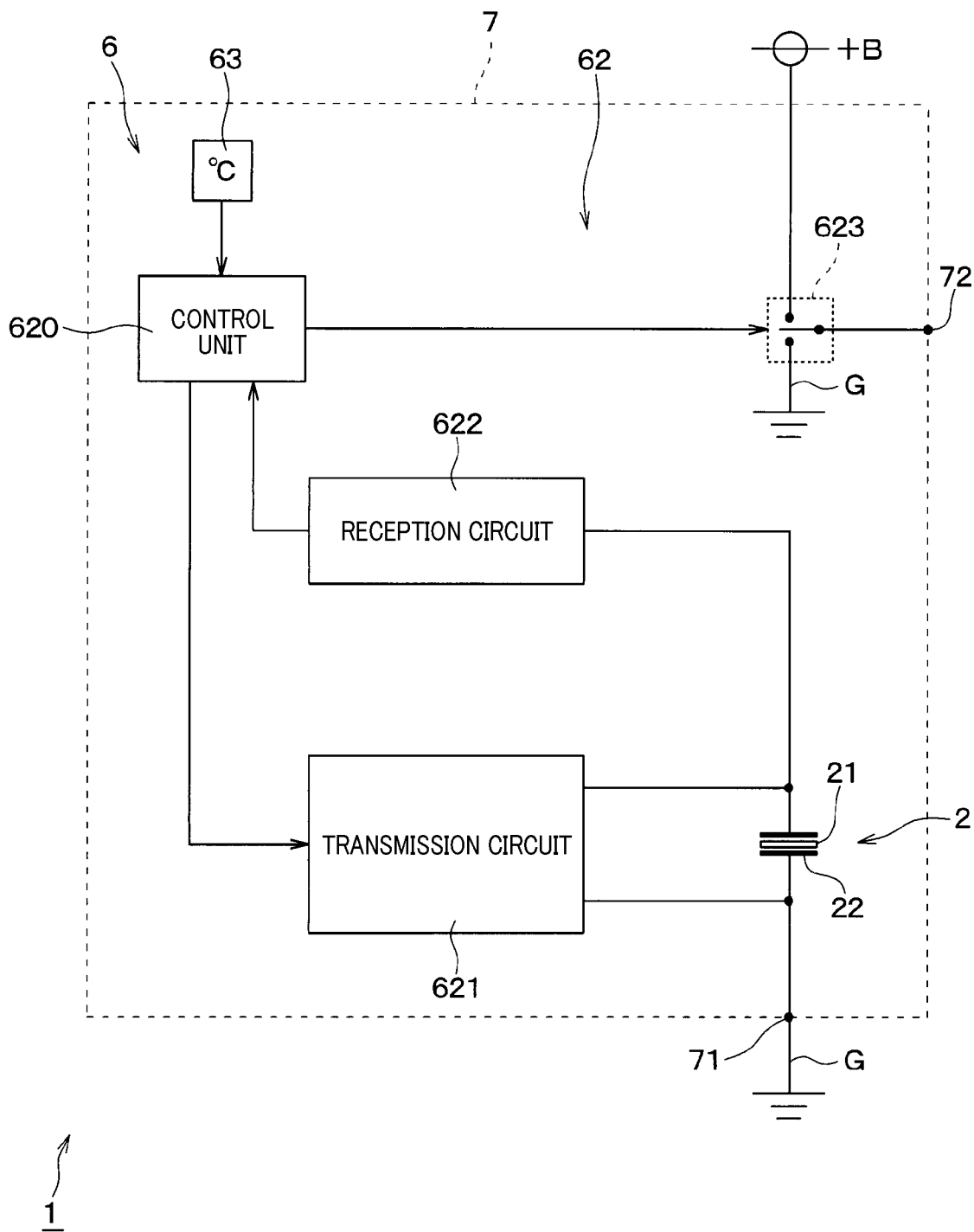
FIG. 2 is a diagram illustrating a schematic circuit configuration of main components of the ultrasonic sensor illustrated in FIG. 1.

FIG. 2 schematically illustrates a circuit configuration of the electric circuit 6 when the ultrasonic sensor 1 according to the present embodiment is electrically connected to a power source B. Referring to FIG. 2, a first terminal 71 that is one end of a current flowing path of the shield member 7 is constantly electrically connected with a grounding wire G that is grounded. A second terminal 72 that is the other end of the current flowing path of the shield member 7 is electrically connected to the power source B in a selective manner. Specifically, the shield member 7 is configured to generate heat when energized while the second terminal 72 is connected to the power source B, and the shield member 7 is configured not to generate heat while the second terminal 72 is connected to the ground wire G.

As described above, the first terminal 71 of the shield member is configured to be constantly connected to a ground wire G to electromagnetically shield at least part of the electric circuit 6; and the second terminal 72 is configured to be selectively connectable to a power source B, the shield member being configured to generate heat when energized while the second end is connected to the power source. Hereinafter, a specific configuration example of how the second terminal 72 is alternatively connected to one of the power source B and the ground wire G will be described.

In the present embodiment, the control circuit unit 62 has a control unit 620, a transmission circuit 621, a reception circuit 622, and a heater switch 623.

The control unit 620 is electrically connected to the transmission circuit 621 to control the transmission circuit 621 to output a drive signal. The transmission circuit 621 is electrically connected to the vibration element 21 to output a drive signal to the vibration element 21 under the control of the control unit 620. The transceiver case 22 is constantly electrically connected to the grounding wire G by constant electrical connection to a reference electrode, that is, a ground-side electrode in the vibration element 21.

The reception circuit 622 is electrically connected to the vibration element 21 to perform signal processing such as amplification on the reception signal generated by the vibration element 21 by receipt of a reflection wave by the ultrasonic wave transceiver 2. The control unit 620 is electrically connected to the reception circuit 622 to receive from the reception circuit 622 the reception signal having undergone the signal processing by the reception circuit 622.

The control unit 620 is electrically connected to the temperature sensor 63 to receive an output corresponding to the temperature of the ultrasonic sensor 1 from the temperature sensor 63. The control unit 620 is electrically connected to the heater switch 623 to control the energization state of the shield member 7 corresponding to the temperature of the ultrasonic sensor 1 detected by the temperature sensor 63. The heater switch 623 is provided to electrically connect the second terminal 72 to one of the power source B and the grounding wire G in an alternative manner under the control of the control unit 620.

(Advantageous Effects)

Hereinafter, an overview of operations in the configuration according to the present embodiment will be provided together with description of advantageous effects produced by the configuration with reference to the drawings.

In the present embodiment, the shield member 7 has the first terminal 71 constantly electrically connected to the grounding wire G. Accordingly, the shield member 7 covers and electromagnetically shields at least part of the electric circuit 6, specifically, the control board 60 and the wiring part 61. The vibration element 21 in the electric circuit 6 is electromagnetically shielded by the grounded metallic transceiver case 22. The second terminal 72 is configured to be selectively connectable to a power source B, the shield member 7 is configured to generate heat when energized while the second terminal 72 is connected to the power source B.

That is, in the foregoing configuration, the shield member 7 electromagnetically shielding at least part of the electric circuit 6 can serve as a heater for preventing or eliminating freezing and snow attachment. Therefore, according to the configuration, it is possible to prevent or eliminate freezing and snow attachment in the ultrasonic sensor 1 while suppressing a rise in manufacturing cost due to increase of components as much as possible.

In the present embodiment, the shield member 7 is configured to generate heat when energized while the second terminal 72 is connected to the power source B, and the shield member 7 is configured not to generate heat while the second terminal 72 is connected to the ground wire G. That is, the shield member 7 is configured not to generate heat while both the first terminal 71 and the second terminal 72 are connected to the grounding wire G. Therefore, according to the configuration, the control board 60 and the like can be electrically shielded in a favorable manner even with the use of the shield member 7 formed of a resistance element.

The ultrasonic sensor 1 detects surrounding objects through transmission/reception of ultrasonic waves by the ultrasonic wave transceiver 2 while a predetermined object detecting operation condition is satisfied. In this respect, in the present embodiment, the control unit 620 energizes the shield member 7 while the object detecting operation condition of the ultrasonic sensor 1 is not satisfied. This makes it possible to favorably prevent or eliminate freezing and snow attachment in the ultrasonic sensor 1 without adverse influence on the object detecting operation of the ultrasonic sensor 1.

In the present embodiment, the control unit 620 controls the energization state of the shield member 7 based on an output of the temperature sensor 63. Specifically, the control unit 620 controls the energization state of the shield member 7 to thereby change, in accordance with a difference between a temperature T of the ultrasonic sensor 1 detected by the temperature sensor 63 and a predetermined reference temperature TF, an amount of heat to be generated by the shield member 7. This achieves a proper control of heat generation in the shield member 7 in accordance with the temperature of the ultrasonic sensor 1, that is, the ambient temperature.

Figure 3:
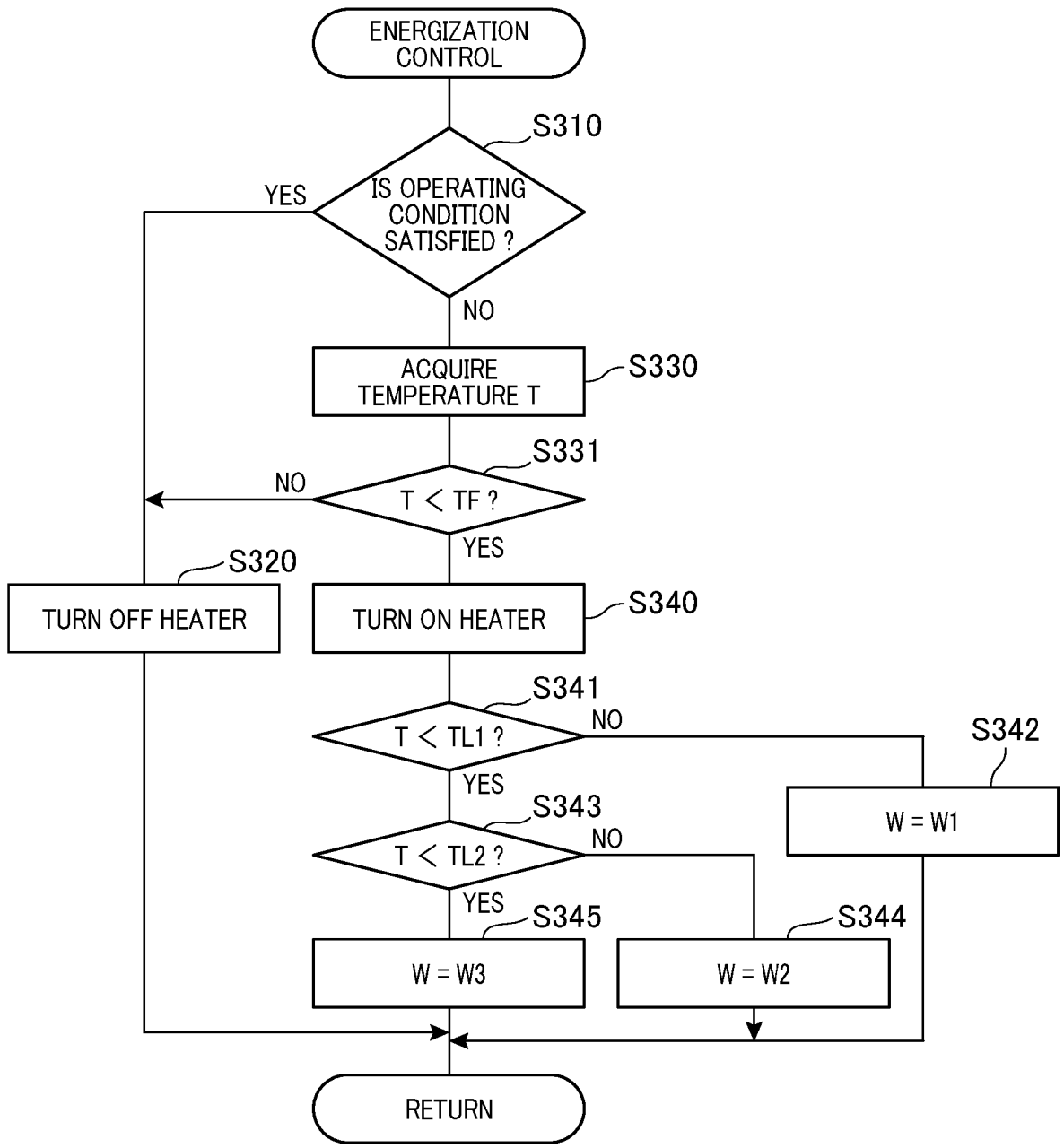
FIG. 3 is a flowchart illustrating an operation example of a control unit illustrated in FIG. 2.

FIG. 3 is a flowchart showing an example of energization control operations performed by the control unit 620 on the shield member 7. In the drawing and the following description herein, the term "step" is abbreviated as "S". This is also applied to the flowchart shown in FIG. 6 described later.

Since a system equipped with the ultrasonic sensor 1 is powered on, for example, since the ignition switch in a vehicle is turned on, the control unit 620 repeatedly activates an energization control routine shown in FIG. 3 at predetermined time intervals. When the energization control routine shown in FIG. 3 is activated, in S310, the control unit 620 first determines whether the object detecting operation condition is satisfied.

When the object detecting operation condition is satisfied (YES in S310), the control unit 620 advances the process to S320 and subsequently temporarily terminates this routine. In S320, the control unit 620 disallows electrical connection between the shield member 7 and the power source B. Accordingly, the heater operation of the shield member 7 is turned off. On the other hand, when the object detecting operation condition is not satisfied (NO in S310), the control unit 620 advances the process to S330 and S331.

In S330, the control unit 620 acquires the temperature T of the ultrasonic sensor 1 based on an output of the temperature sensor 63. In S331, the control unit 620 determines whether the temperature T acquired in S330 is lower than the reference temperature TF.

When the temperature T is equal to or higher than the reference temperature TF (NO in S331), the control unit 620 advances the process to S320 and subsequently temporarily terminates this routine. That is, in this case, the control unit 620 disallows electrical connection between the shield member 7 and the power source B. Accordingly, the heater operation of the shield member 7 is turned off.

When the temperature T is lower than the reference temperature TF (YES in S331), the control unit 620 advances the process to S340 and the subsequent steps. That is, in S340, the control unit 620 allows electrical connection between the shield member 7 and the power source B. Accordingly, the heater operation by the shield member 7 is turned on. The control unit 620 also executes a heat generation control in accordance with the temperature T of the ultrasonic sensor 1 by the processing in S341 and the subsequent steps.

Specifically, in S341, the control unit 620 first determines whether the temperature T is lower than the temperature TL1 where TL1<TF.

When the temperature T is equal to or higher than the temperature TL1 (NO in S341), the control unit 620 advances the process to S342 and subsequently temporarily terminates this routine. In S342, the control unit 620 sets the heat generation amount W to W1. Specifically, the control unit 620 adjusts the magnitude or duty ratio of the current flowing through the shield member 7 such that the heat generation amount W of the shield member 7 becomes W1.

When the temperature T is lower than the temperature TL1 (YES in S341), the control unit 620 advances the process to S343. In S343, the control unit 620 determines whether the temperature T is lower than a temperature TL2 where TL2<TL1.

When the temperature T is equal to or higher than the temperature TL2 (NO in S343), the control unit 620 advances the process to S344 and subsequently temporarily terminates this routine. In S344, the control unit 620 sets the heat generation amount W to W2 where W1<W2.

When the temperature T is lower than the temperature TL2 (YES in S343), the control unit 620 advances the process to S345 and subsequently temporarily terminates this routine. In S345, the control unit 620 sets the heat generation amount W to W3 where W2<W3.

Modification Example

The present disclosure is not limited to the foregoing embodiments. Therefore, the foregoing embodiments can be modified as appropriate. Hereinafter, typical modification examples will be described. The following of the modification examples will focus on differences from the foregoing embodiments. In the embodiments and the modification examples, the same or equivalent parts are assigned the same reference signs. Therefore, in the following description of the modification examples, as for the constituent elements with the same reference signs as those in the foregoing embodiments, the foregoing descriptions in relation to the embodiments are incorporated as appropriate unless there is any technical inconsistency or particular additional specification.

The ultrasonic sensor 1 is not limited to a configuration capable of transmitting and receiving ultrasonic waves. That is, for example, the ultrasonic sensor 1 may be capable of only transmitting ultrasonic waves. Otherwise, the ultrasonic sensor 1 may have only a function of receiving reflection waves from surrounding objects to which probe waves as ultrasonic waves have been transmitted by other ultrasonic transmitters.

The configurations of components of the ultrasonic sensor 1 are not limited to the foregoing specific examples. Specifically, for example, the outer shape of the ultrasonic wave transceiver 2 is not limited to a substantially circular column but may be a substantially hexagonal column or a substantially octagonal column, or the like. The vibration element 21 is not limited to a piezoelectric element but may be a static capacitance element.

In the foregoing embodiments, the shield member 7 is provided in the sensor case 5 to mainly heat the sensor case 5. Specifically, the shield member 7 is fixed to the inner surface of the sensor case 5. However, the present disclosure is not limited to this mode.

Figure 4:
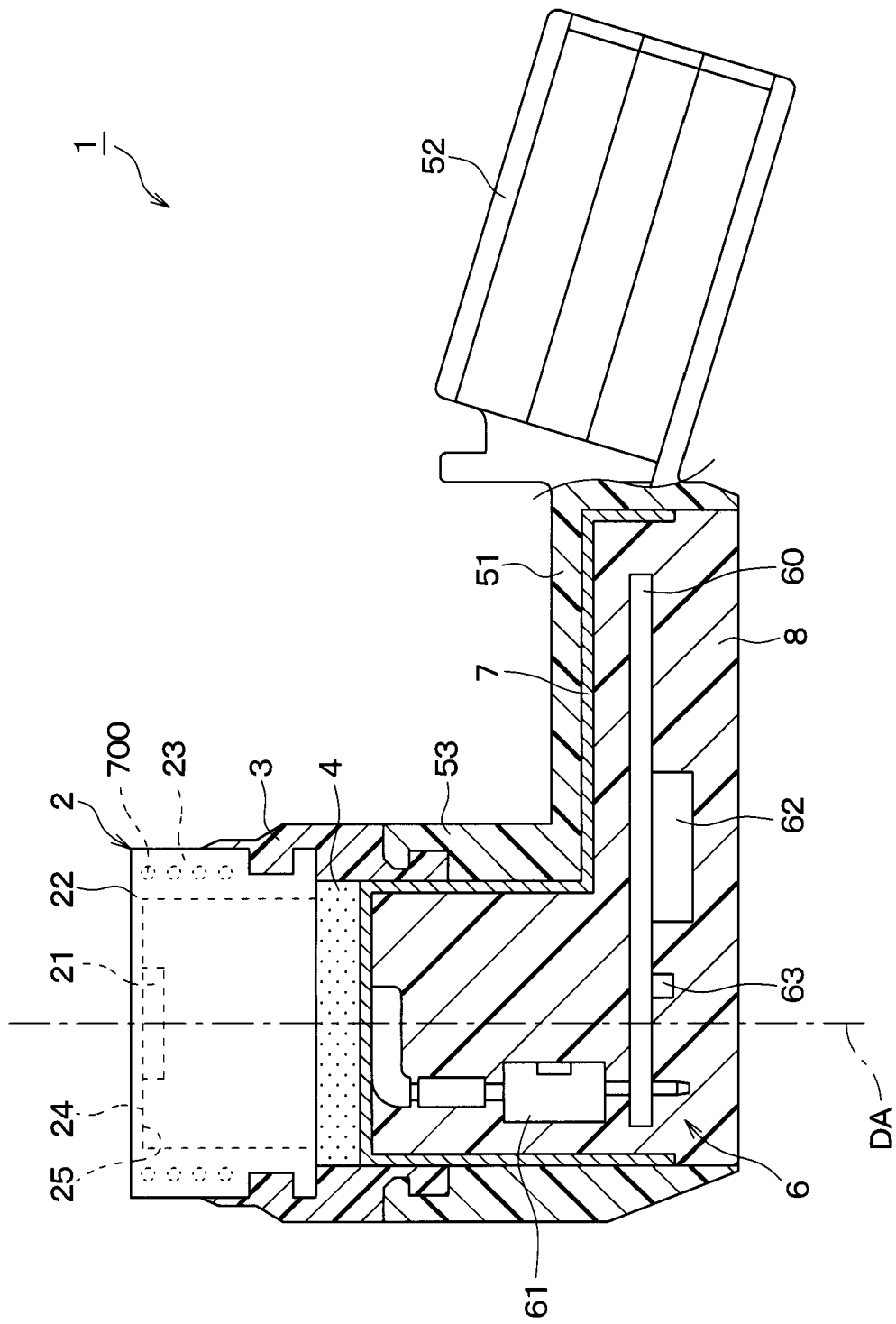
FIG. 4 is a side cross-sectional view of a schematic device configuration of an ultrasonic sensor according to a modification example.

In an ultrasonic sensor 1 according to a modification example illustrated in FIG. 4, the transceiver case 22 is integrally formed in a seamless manner from an insulating synthetic resin. A transceiver shield member 700 is embedded in the transceiver case 22 made of an insulating synthetic resin.

In the present modification example, the transceiver shield member 700 is a coil-type electric heating wire that is formed of a metallic resistance element such as a nickel-chrome alloy and surrounds the directional axis DA. The transceiver shield member 700 is provided in the diaphragm support part 23.

In the configuration of the present modification example, the ultrasonic wave transceiver 2 in the ultrasonic sensor 1 that is likely to be closest to cold air is favorably heated by the transceiver shield member 700. Therefore, according to this configuration, it is possible to favorably prevent or eliminate freezing and snow attachment in the ultrasonic sensor 1.

In the configuration of the modification example illustrated in FIG. 4, the shield member 7 provided on the sensor case 5 side can be omitted. That is, the ultrasonic sensor 1 may be heated by only the transceiver shield member 700.

The transceiver shield member 700 may be provided in the diaphragm part 24 unless the function of the ultrasonic wave transceiver 2 of transmitting and receiving ultrasonic waves is adversely influenced. Specifically, for example, the transceiver shield member 700 can be provided in the diaphragm part 24 at an outer edge part that is connected to the diaphragm support part 23.

The transceiver shield member 700 can be provided in one of the diaphragm support part 23 and the diaphragm part 24. Alternatively, the transceiver shield member 700 can be provided to straddle the diaphragm support part 23 and the diaphragm part 24.

The shield member 7 can be divided into a plurality of divided shield members. Also, in the configuration of the modification example illustrated in FIG. 4, the shield member 7 provided on the sensor case 5 side and the transceiver shield member 700 can be regarded as constituting respective pluralities of divided shield members. There is no particular limitation on the number of divisions N of the shield member 7, where N represents an integer of 2 or larger. That is, the configuration of the modification example illustrated in FIG. 4 corresponds to the case where N=2.

Figure 5:
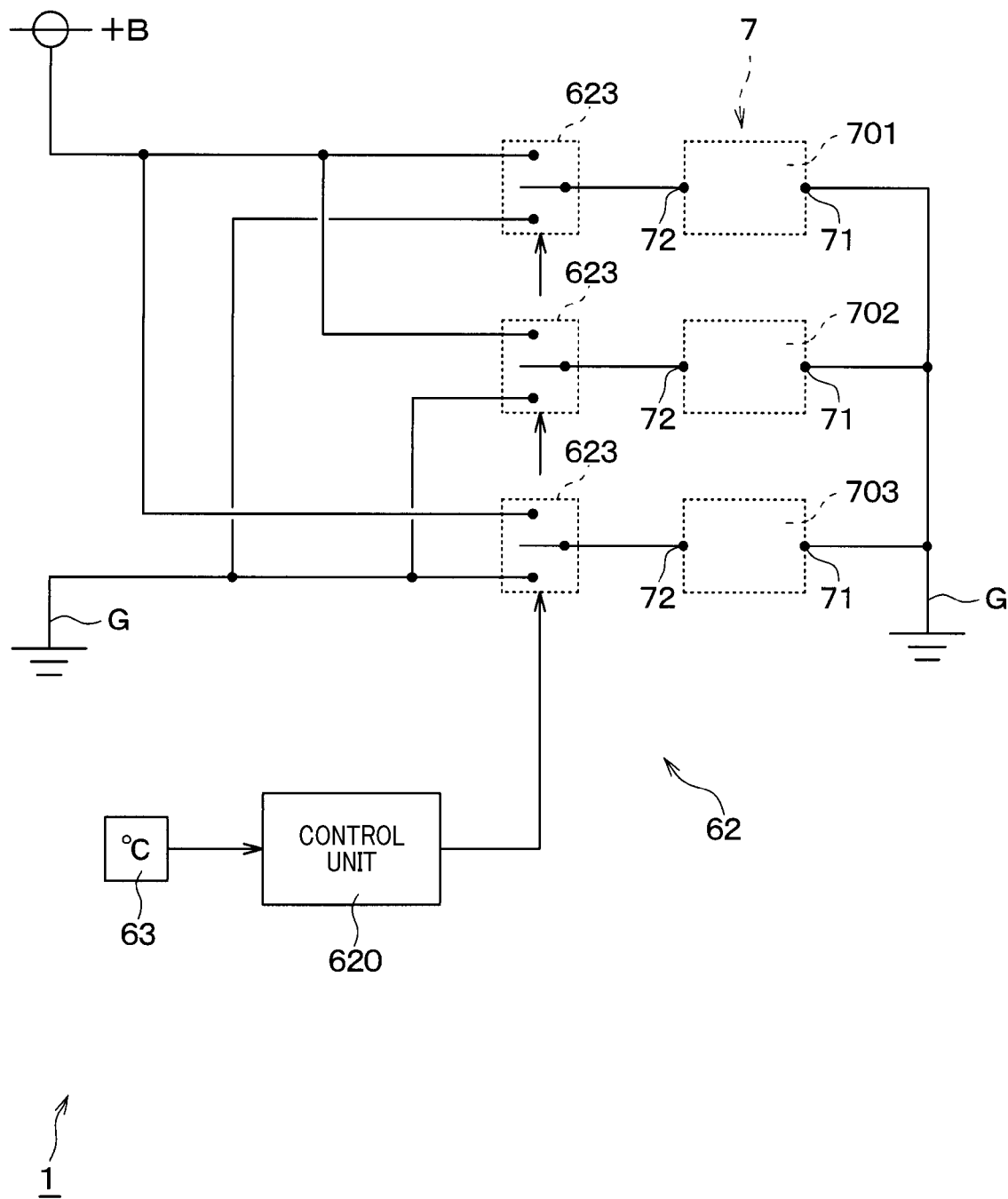
FIG. 5 is a diagram illustrating a schematic circuit configuration in main components of an ultrasonic sensor according to another modification example.

FIG. 5 illustrates a circuit configuration example of the shield member 7 that is divided into three divided shield members, that is, a first shield member 701, a second shield member 702, and a third shield member 703. As illustrated in FIG. 5, the control circuit unit 62 has the same number of heater switches 623 as the number of the divided shield members, that is, three heater switches 623 arranged in parallel between the power source B and the grounding wire G.

The control unit 620 is provided to individually control respective energization states of the plurality of divided shield members, that is, the first shield member 701, the second shield member 702, and the third shield member 703. Specifically, the control unit 620 is configured to control the presence or absence of energization to each of the first shield member 701, the second shield member 702, and the third shield member 703 according to the difference between the temperature T of the ultrasonic sensor 1 detected by the temperature sensor 63 and the predetermined reference temperature TF.

FIG. 6 illustrates an operation example of the configuration illustrated in FIG. 5. Referring to FIG. 6, the term "heater H1" corresponds to the first shield member 701, "heater H2" corresponds to the second shield member 702, and "heater H3" corresponds to the third shield member 703.

When the energization control routine illustrated in FIG. 6 is started, the control unit 620 first determines in S610 whether the object detecting operation condition is satisfied. When the object detecting operation condition is satisfied (YES in S610), the control unit 620 advances the process to S615 and subsequently temporarily terminates this routine. In S615, the control unit 620 disallows respective electrical connections of the first shield member 701, the second shield member 702, and the third shield member 703 to the power source B. Accordingly, respective heater operations of the first shield member 701, the second shield member 702, and the third shield member 703 are turned off.

When the object detecting operation condition is not satisfied (NO in S610), the control unit 620 advances the process to S630 and S631.

In S630, the control unit 620 acquires the temperature T of the ultrasonic sensor 1 based on the output of the temperature sensor 63. In S631, the control unit 620 determines whether the temperature T acquired in S630 is lower than the reference temperature TF.

When the temperature T is equal to or higher than the reference temperature TF (NO in S631), the control unit 620 advances the process to S615 and subsequently temporarily terminates this routine. That is, in this case, the control unit 620 disallows the respective electrical connections of the first shield member 701, the second shield member 702, and the third shield member 703 to the power source B. Accordingly, the respective heater operations of the first shield member 701, the second shield member 702, and the third shield member 703 are turned off.

When the temperature T is lower than the reference temperature TF (YES in S631), the control unit 620 advances the process to S650 and S651. In S650, the control unit 620 electrically connects the first shield member 701 to the power source B. Accordingly, the heater operation of the first shield member 701 is turned on. Next, in S651, the control unit 620 determines whether the temperature T is lower than the temperature TL1 where TL1<TF.

When the temperature T is equal to or higher than the temperature TL1 (NO in S651), the control unit 620 advances the process to S652 and subsequently temporarily terminates this routine. In S652, the control unit 620 disallows the respective electrical connections of the second shield member 702 and the third shield member 703 to the power source B. Accordingly, the respective heater operations of the second shield member 702 and the third shield member 703 are turned off. That is, when the temperature T is lower than the reference temperature TF and is equal to or higher than the temperature TL1, among the first shield member 701, the second shield member 702, and the third shield member 703, only the first shield member 701 is energized.

When the temperature T is lower than the temperature TL1 (YES in S651), the control unit 620 advances the process to S653 and S654. In S653, the control unit 620 electrically connects the second shield member 702 to the power source B. Accordingly, the heater operation of the second shield member 702 is turned on. Next, in S654, the control unit 620 determines whether the temperature T is lower than the temperature TL2 where TL2<TL1.

When the temperature T is equal to or higher than the temperature TL2 (NO in S654), the control unit 620 advances the process to S655 and subsequently temporarily terminates this routine. In S655, the control unit 620 disallows the electrical connection of the third shield member 703 to the power source B. Accordingly, the respective heater operations of the first shield member 701 and the second shield member 702 are turned on, whereas the heater operation of the third shield member 703 is turned off. That is, when the temperature T is lower than the temperature TL1 and is equal to or higher than the temperature TL2, among the first shield member 701, the second shield member 702, and the third shield member 703, the first shield member 701 and the second shield member 702 are energized.

When the temperature T is lower than the temperature TL2 (YES in S654), the control unit 620 advances the process to S656 and subsequently temporarily terminates this routine. In S656, the control unit 620 electrically connects the third shield member 703 to the power source B. Accordingly, the heater operation of the third shield member 703 is turned on. That is, in this case, the first shield member 701, the second shield member 702, and the third shield member 703 are all energized.

By a combination of the configuration illustrated in FIG. 4 and the configuration illustrated in FIG. 5, the control unit 620 can be configured to control the energization states of the shield member 7 provided on the sensor case 5 side and the transceiver shield member 700 depending on the temperature T. Specifically, the control unit 620 can be configured to switch among a first mode in which only the shield member 7 provided on the sensor case 5 side generates heat, a second mode in which only the transceiver shield member 700 generates heat, and a third mode in which both of them generate heat, depending on the temperature T.

The ultrasonic sensor 1 may not include the temperature sensor 63. In this case, the temperature sensor 63 can be mounted in a system (for example, a vehicle) equipped with the ultrasonic sensor 1 at a position different from the ultrasonic sensor 1. Specifically, the temperature sensor 63 may be an outside air temperature sensor in a vehicle air conditioner, for example. Otherwise, the temperature sensor 63 may be an intake air temperature sensor in a vehicle equipped with an internal combustion engine.

In each of the specific examples described above, the control unit 620 is mounted in the ultrasonic sensor 1 to control the energization state, that is, the heat generation state of the shield member 7. Accordingly, in a case where the system is equipped with a plurality of ultrasonic sensors 1, it is possible to execute favorable heater control in accordance with differences in status between the plurality of ultrasonic sensors 1. That is, for example, it is possible to autonomously execute heater control corresponding to a difference in ambient temperature between the ultrasonic sensor 1 located at a sunlit part of the vehicle and the ultrasonic sensor 1 located at a shaded part of the vehicle.

However, the present disclosure is not limited to the foregoing mode. Specifically, for example, the control unit 620 controlling the energization state, that is, the heat generation state of the shield member 7 may be provided in an external device such as an electronic control unit that is electrically connected to a plurality of ultrasonic sensors 1. That is, the plurality of ultrasonic sensors 1 may be subjected to centralized heater control by an external device such as an electronic control unit.

The plurality of constituent elements described above as being integrally formed in a seamless manner may be formed by attaching separate members to each other. Similarly, the plurality of constituent elements formed by attaching separate members to each other may be integrally formed in a seamless manner.

The plurality of constituent elements described above as being formed of the same material may be formed of different materials. Similarly, the plurality of constituent elements formed of different materials may be formed of the same material.

It is obvious that the elements constituting the foregoing embodiment are not necessarily essential except when they are specifically described as essential or clearly considered to be essential on principle. When the numbers, values, quantities, and ranges of the constituent elements are specified, the present disclosure is not limited to these values unless these values are clearly described to be essential and the constituent elements are clearly limited to the specific values on principle. Similarly, when the shapes, directions, positional relationships, and others of the constituent elements are specified, the present disclosure is not limited to these shapes, directions, positional relationships, and others, unless these shapes, directions, positional relationships, and others are clearly described to be essential and the constituent elements are limited to the shapes, directions, positional relationships, and others on principle.

The modification example is not limited to the foregoing examples. In addition, a plurality of modification examples can be combined. All or some parts of the foregoing embodiments can be combined with all or some parts of arbitrary modification examples.

What is claimed is:

1. An ultrasonic sensor comprising:
    an ultrasonic wave transceiver that includes a vibration element with a function for converting between mechanical vibration and an electrical signal and a transceiver case configured to cover the vibration element;
    a sensor case that accommodates a control board electrically connected to the ultrasonic wave transceiver and supports the ultrasonic wave transceiver; and
    a shield member that electromagnetically shields at least part of an electric circuit including the vibration element and the control board, and has a first end and a second end, wherein
        the first end of the shield member is configured to be constantly connected to a ground wire to electromagnetically shield at least part of the electric circuit; and
        the second end is configured to be selectively connectable to a power source, the shield member being configured to generate heat when energized while the second end is connected to the power source.

2. The ultrasonic sensor according to claim 1, wherein
    the shield member is configured to generate heat when energized while the second end is connected to the power source, and
    the shield member is configured not to generate heat while the second end is connected to the ground wire.

3. The ultrasonic sensor according to claim 1, wherein the shield member is provided in the sensor case to cover the control board.

4. The ultrasonic sensor according to claim 1, wherein the shield member is embedded in the transceiver case, the transceiver case being made of an insulating synthetic resin.

5. The ultrasonic sensor according to claim 1, further comprising a control unit that controls energization state of the shield member.

6. The ultrasonic sensor according to claim 5, wherein the control unit is configured to energize the shield member while an object detecting operation condition of the ultrasonic sensor is unsatisfied.

7. The ultrasonic sensor according to claim 5, wherein the control unit is configured to control the energization state of the shield member based on an output of a temperature sensor that generates the output indicative of a temperature of the ultrasonic sensor.

8. The ultrasonic sensor according to claim 7, wherein the control unit is configured to control the energization state of the shield member to thereby change, in accordance with a difference between the temperature and a predetermined reference temperature, an amount of heat to be generated by the shield member.

9. The ultrasonic sensor according to claim 8, wherein
    the shield member is comprised of a plurality of divided shield members, and
    the control unit is configured to individually control respective energization states of the plurality of divided shield members.

* * * * *